United States Patent
Sico et al.

(10) Patent No.: US 8,991,785 B2
(45) Date of Patent: Mar. 31, 2015

(54) METHODS AND APPARATUS FOR SEALING A SLIT VALVE DOOR

(75) Inventors: Angela Rose Sico, Round Rock, TX (US); Michael R. Rice, Pleasanton, CA (US); James D. Strassner, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 1384 days.

(21) Appl. No.: 12/256,458

(22) Filed: Oct. 22, 2008

(65) Prior Publication Data

US 2009/0108544 A1    Apr. 30, 2009

Related U.S. Application Data

(60) Provisional application No. 60/983,144, filed on Oct. 26, 2007.

(51) Int. Cl.
*F16K 3/06* (2006.01)
*H01L 21/67* (2006.01)
*H01L 21/677* (2006.01)

(52) U.S. Cl.
CPC ............. *F16K 3/06* (2013.01); *H01L 21/67126* (2013.01); *H01L 21/67772* (2013.01)
USPC ........... 251/284; 251/332; 251/334; 277/648; 277/650

(58) Field of Classification Search
CPC ................ F16K 3/06; H01L 21/67772; H01L 21/67126
USPC .......... 251/284, 326, 328, 332, 334; 277/644, 277/648, 650–651
See application file for complete search history.

(56) References Cited

U.S. PATENT DOCUMENTS

| 1,645,785 | A | * | 10/1927 | Wilson | ......................... 251/203 |
|---|---|---|---|---|---|
| 2,194,261 | A | * | 3/1940 | Allen | ........................... 251/328 |
| 2,815,187 | A | * | 12/1957 | Hamer | ......................... 251/328 |
| 3,401,915 | A | * | 9/1968 | Kim | ............................. 251/174 |
| 3,876,654 | A | | 4/1975 | Pattison | |
| 4,163,544 | A | * | 8/1979 | Fowler et al. | ................. 251/328 |
| 4,214,060 | A | | 7/1980 | Apotheker et al. | |
| 4,300,773 | A | * | 11/1981 | Jelinek | ......................... 277/630 |
| 4,453,723 | A | * | 6/1984 | Greenwald | .................. 277/618 |
| 5,013,009 | A | * | 5/1991 | Nelson | ......................... 251/357 |
| 5,188,402 | A | * | 2/1993 | Colgate et al. | ................ 285/332 |
| 5,363,872 | A | * | 11/1994 | Lorimer | ........................... 137/1 |
| 5,390,939 | A | | 2/1995 | Terauchi et al. | |
| 5,482,297 | A | | 1/1996 | Burns et al. | |

(Continued)

FOREIGN PATENT DOCUMENTS

EP    1 087 157 A2    3/2001

OTHER PUBLICATIONS

International Search Report and Written Opinion of International Application No. PCT/US08/80842 mailed Jan. 12, 2009.

*Primary Examiner* — John Bastianelli
(74) *Attorney, Agent, or Firm* — Patterson & Sheridan, LLP

(57) ABSTRACT

Apparatus, methods and systems are provided for sealing the door of a slit valve. In one embodiment, the apparatus includes a seal, adapted to extend along a perimeter of a slit valve door; and a hard stop, disposed between the seal and an outer edge of the slit valve door, and adapted to extend along the length of the seal, wherein the hard stop and elastomer seal fill at least a portion of a gap between the slit valve door and an insert leading to a process chamber.

23 Claims, 8 Drawing Sheets

(56) References Cited

U.S. PATENT DOCUMENTS

| | | |
|---|---|---|
| 5,579,718 A | 12/1996 | Freerks |
| 5,722,668 A | 3/1998 | Rice et al. |
| 5,789,489 A | 8/1998 | Coughlin et al. |
| 5,951,770 A | 9/1999 | Perlov et al. |
| 6,053,980 A | 4/2000 | Suda et al. |
| 6,074,519 A | 6/2000 | Lee et al. |
| 6,089,543 A | 7/2000 | Freerks |
| 6,114,452 A | 9/2000 | Schmiegel |
| 6,173,969 B1 | 1/2001 | Stoll et al. |
| 6,245,149 B1 | 6/2001 | de Lomenie et al. |
| 6,281,296 B1 | 8/2001 | MacLachlan et al. |
| 6,287,386 B1 | 9/2001 | Perlov et al. |
| 6,305,695 B1 | 10/2001 | Wilson |
| 6,328,316 B1 | 12/2001 | Fukuhara et al. |
| 6,468,353 B1 | 10/2002 | Perlov et al. |
| 6,575,737 B1 | 6/2003 | Perlov et al. |
| 6,629,682 B2 | 10/2003 | Duelli |
| 6,764,265 B2 | 7/2004 | Kunze et al. |
| 6,916,397 B2 | 7/2005 | Pfeiffer et al. |
| 6,932,354 B2 | 8/2005 | Kane et al. |
| 7,011,294 B1 * | 3/2006 | Ehrne et al. .................... 251/328 |
| 7,207,766 B2 | 4/2007 | Kurita et al. |
| 2002/0170672 A1 | 11/2002 | Perlov et al. |
| 2004/0206921 A1 | 10/2004 | Blonigan et al. |
| 2005/0072716 A1 | 4/2005 | Quiles et al. |
| 2005/0225039 A1 * | 10/2005 | Seki et al. ...................... 277/637 |
| 2005/0269334 A1 | 12/2005 | Bang et al. |
| 2005/0274459 A1 * | 12/2005 | Tanase et al. ............ 156/345.31 |
| 2006/0273277 A1 | 12/2006 | Heller et al. |
| 2007/0141748 A1 | 6/2007 | Rice |
| 2007/0234557 A1 | 10/2007 | Nielsen et al. |
| 2009/0045371 A1 | 2/2009 | Kamibayashiyama |

* cited by examiner

METHODS AND APPARATUS FOR SEALING A SLIT VALVE DOOR

The present application claims priority to U.S. Provisional Patent Application No. 60/983,144 filed Oct. 26, 2007, and entitled "METHODS AND APPARATUS FOR SEALING A SLIT VALVE DOOR" which is hereby incorporated herein by reference in its entirety for all purposes.

FIELD OF THE INVENTION

The present invention relates generally to substrate processing systems, and is more particularly concerned with apparatus and methods for preserving a seal used with a slit valve door.

BACKGROUND OF THE INVENTION

Processing of substrates (e.g., semiconductor, glass, etc.) for use in electronic devices is typically done in one or more processing chambers. The substrates may be moved between the processing chambers via a central transfer chamber. A slit valve connects the central transfer chamber to a processing chamber. A slit valve door may be employed to selectively block entrance of the slit valve, thereby sealing the transfer chamber from the process chamber. An insert may be positioned within the slit valve entrance to form a better seal for the slit valve door. The insert includes a tunnel that allows the substrate to pass between the transfer chamber and the process chamber. The chambers must be kept relatively free from particulates that may damage the substrates. In conventional systems, both the slit valve door and the insert are made of metal. The opening and closing of the slit valve door may cause the two metal surfaces to rub against each other, resulting in metal particles falling off the slit valve door and insert. Thus, to prevent the formation of metal particles, the slit valve door and the insert are oriented such that a gap exists between the slit valve door and the insert. A compressible seal, made of an elastomer, may be used to fill a portion of the gap and to create an air tight seal between the slit valve door and the insert.

Particulate byproducts, such as aluminum chloride, produced during substrate processing, may settle on the slit valve door as well as the exposed edge of the elastomer seal. The interior of the processing chamber is generally a higher temperature than the slit valve door/elastomer seal due to the heat given off during processing of the substrate in the processing chamber. As the particulate byproducts are attracted to cooler surfaces, the particulate byproducts are attracted to, and may settle on, the slit valve door and exposed edge of the elastomer seal. The closing and opening of the slit valve door causes the seal to compress and decompress, respectively. Over time, compressing and decompressing the seal may cause the particulate byproducts to flake off of the elastomer seal. The byproduct flakes may, in turn, contaminate the substrate processing. Thus, conventional seals must be replaced relatively frequently so that any accumulated byproducts do not become loose contaminates. Accordingly a need exists for an apparatus that allows the elastomer seal to be replaced less frequently.

SUMMARY OF THE INVENTION

In certain aspects of the invention, an apparatus is employed for sealing a door of a slit valve. A seal is adapted to extend along a perimeter of a slit valve door. A hard stop is disposed between the seal and an outer edge of the slit valve door. The hard stop is adapted to extend along at least a portion of the length of the seal. The hard stop and the seal fill at least a portion of a gap between the slit valve door and a substrate sealing surface.

In other aspects of the invention, an apparatus for sealing a door of a slit valve is provided. A seal of flexible sealing material is adapted to extend along at least one of a perimeter of a slit valve door and an opening in a component leading to a process chamber. A hard stop is disposed alongside the seal along at least a portion of a length of the seal. The hard stop and the seal fill at least a portion of a gap between the slit valve door and a component leading to a processing chamber.

In yet other aspects of the invention, a method for sealing a slit valve door is provided. The method includes providing a seal of flexible seal material between a surface surrounding an opening to a process chamber and a surface of the slit valve door; disposing a hard stop alongside at least a portion of the seal; and compressing the seal between the surface of the slit valve door and the surface adjacent to the opening whereby deformation of the seal is limited by the hard stop.

In another aspect of the invention, a method for sealing the door of a slit valve includes, adhering an seal to a groove extending along a perimeter of a surface of a slit valve door, disposing a hard stop along at least a portion of a perimeter of the surface of the slit valve door between the seal and an outer edge of the slit valve door, and compressing the seal between the inner surface of the slit valve door and an insert leading to a processing chamber.

In other aspects of the invention, a system is employed including a transfer chamber, a processing chamber, a slit valve connecting the transfer chamber to the processing chamber, a slit valve door, selectively positioned in front of a substrate sealing surface, and a sealing apparatus including a seal and a hard stop adapted to fill a portion of a gap between the slit valve door and the substrate sealing surface, wherein the hard stop is positioned between the seal and an outer edge of the slit valve door.

Other features and aspects of the present invention will become more fully apparent from the following detailed description, the appended claims and the accompanying drawings.

DETAILED DESCRIPTION

The present invention provides systems, methods, and apparatus for decreasing the exposure of a slit valve door seal to the particulate byproducts by decreasing the width of the gap between the slit valve door and a component such as an insert leading to the seal, thereby extending the life of the seal. Increasing the aspect ratio of the length of the gap to the width of the gap creates a path to the seal that takes longer (e.g., more process cycles) for the particulate byproducts to reach the seal.

In some embodiments, the seal is adhered to the slit valve door using a bonding (e.g., vulcanization) process. A byproduct of the bonding process may be a flashing material that may extend from the seal. In some embodiments, the flashing material may be used as a hard stop in the gap to provide a reference to decrease a width of the gap. The thickness of the hard stop may be adapted to limit compression and decompression of the seal, thereby providing a consistent reference for setting the gap when closing the slit valve door. In other words, when the seal is fully compressed, a largest width of the gap may be a width of the hard stop.

Further details of exemplary embodiments of the present invention are described with reference to FIGS. 1-8 herein.

Figure 1:
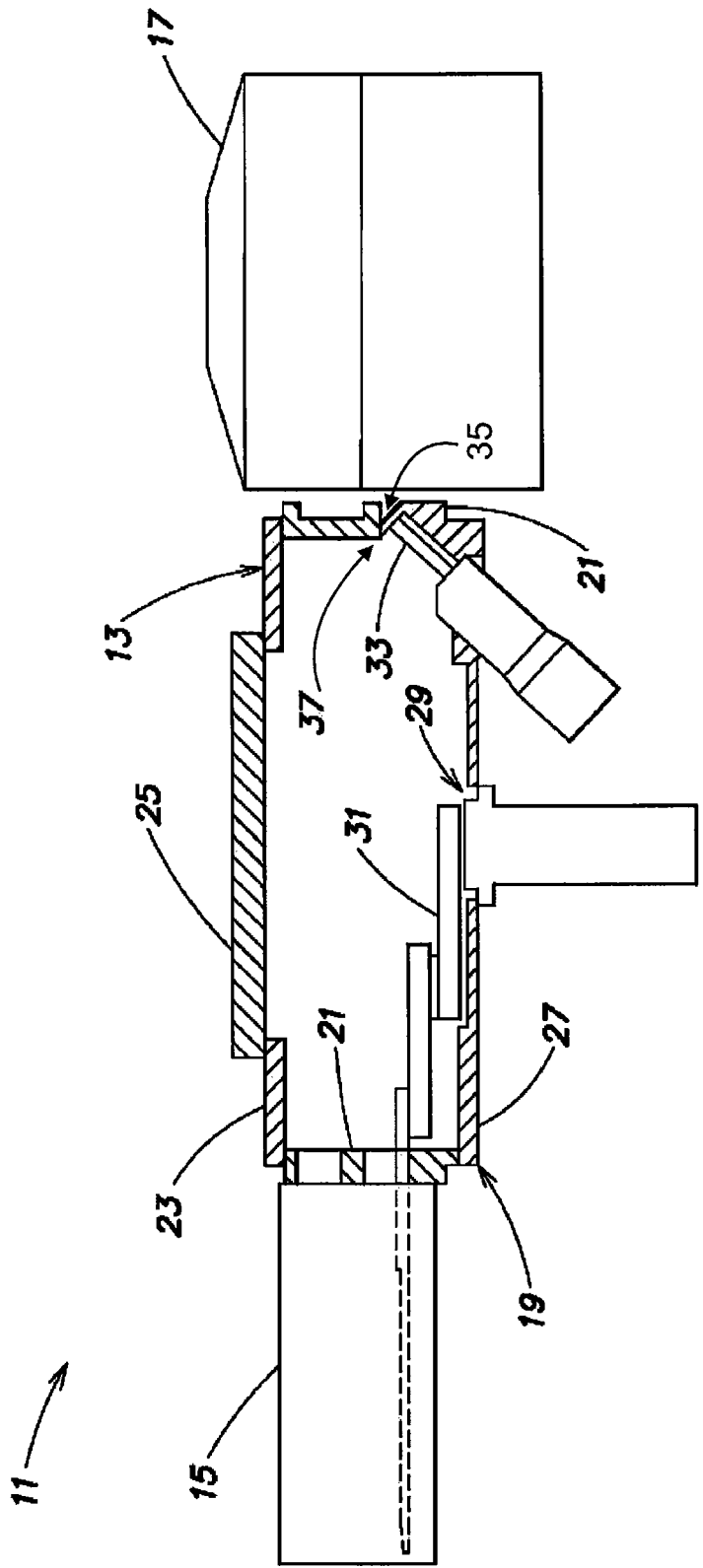
FIG. 1 is a partial cross-sectional side view of a substrate processing system according to some embodiments of the present invention.

FIG. 1 is a partially cross-sectioned side view of a substrate processing system. Reference numeral 11 generally indicates the substrate processing tool. The processing tool 11 may include a centrally-positioned transfer chamber 13. A load lock chamber 15 and a processing chamber 17 are shown coupled to respective sides of the transfer chamber 13. One or more additional process chambers and/or load lock chambers, (shown hereinafter in FIG. 2), may also be coupled to respective sides of the transfer chamber 13. The load lock chamber 15 may be provided to accommodate introduction of substrates into the processing tool 11 from outside of the processing tool 11.

The transfer chamber 13 may include a main body 19 having side walls 21 (of which only two are visible in FIG. 1). Each side wall 21 may be adapted to have a load lock 15 or processing chamber 17 coupled thereto. The transfer chamber 13 may also include a top 23 supported on the main body 19. A lid 25 may be provided to seal closed the top 23 of the transfer chamber 13.

A lower end of the transfer chamber 13 may be closed by a substantially annular bottom 27. The bottom 27 of the transfer chamber 13 may have a central aperture 29 to accommodate installation of a substrate handling robot 31 in the transfer chamber 13. The substrate handling robot 31 may be adapted to transfer substrates among the processing chambers 17 and the load lock chamber or chambers 15 coupled to transfer chamber 13.

To minimize the possibility of contamination of substrates processed in the processing tool 11, it is customary to maintain a vacuum in the interior of the transfer chamber 13. Hence, the processing tool 11 may be referred to as a vacuum processing system. A pumping system (not shown) may be coupled to the transfer chamber 13 to pump the transfer chamber 13 down to a suitable degree of vacuum.

The tool 11 may also include an actuator 33 to selectively open and close a door 35 of a slit valve 37 associated with the processing chamber 17. When the slit valve door 35 is in an open position (not shown), a substrate may be introduced into or removed from the processing chamber 17. When the slit valve door 35 is in the closed position, as illustrated in FIG. 1, the processing chamber 17 may be isolated from the transfer chamber 13 so that a fabrication process, for example, may be performed on a substrate within the processing chamber 17. While the door 35 shown in FIG. 1 is positioned such that the door 35 may move between an open and closed position along a path that is at a 45 degree angle to the processing chamber 17, any other suitably positioned door may be used. For example, the door may be positioned to move along an L-shaped path where the door moves towards the lid 25 and then towards the processing chamber 17 to be in a closed position, or, in another embodiment, the door may be positioned to move along a vertical path where the door moves towards the lid 25 to be in a closed position.

Figure 2:
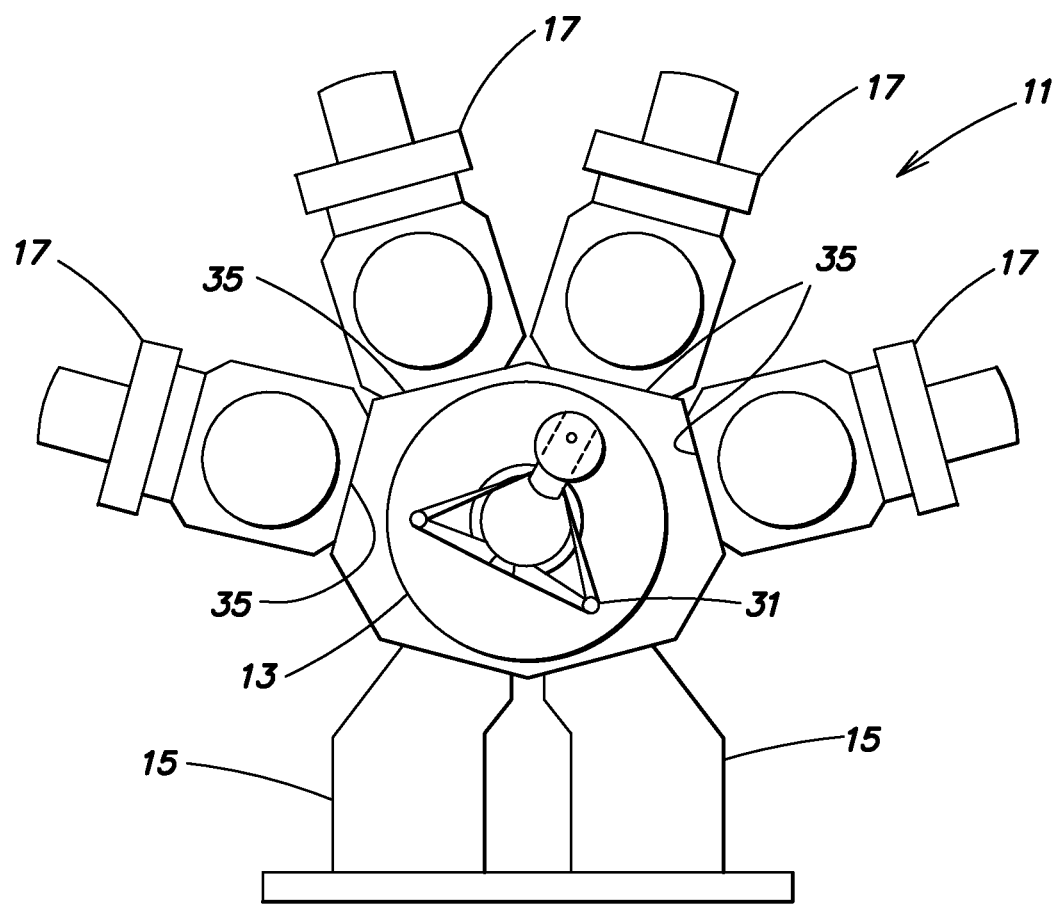
FIG. 2 is a top view of a substrate processing system according to some embodiments of the present invention.

FIG. 2 is a top view of the substrate processing tool 11 described in FIG. 1. As shown herein, additional processing chambers 17 and/or load lock chambers 15 may be coupled to respective sides of the transfer chamber 13.

Figure 3:
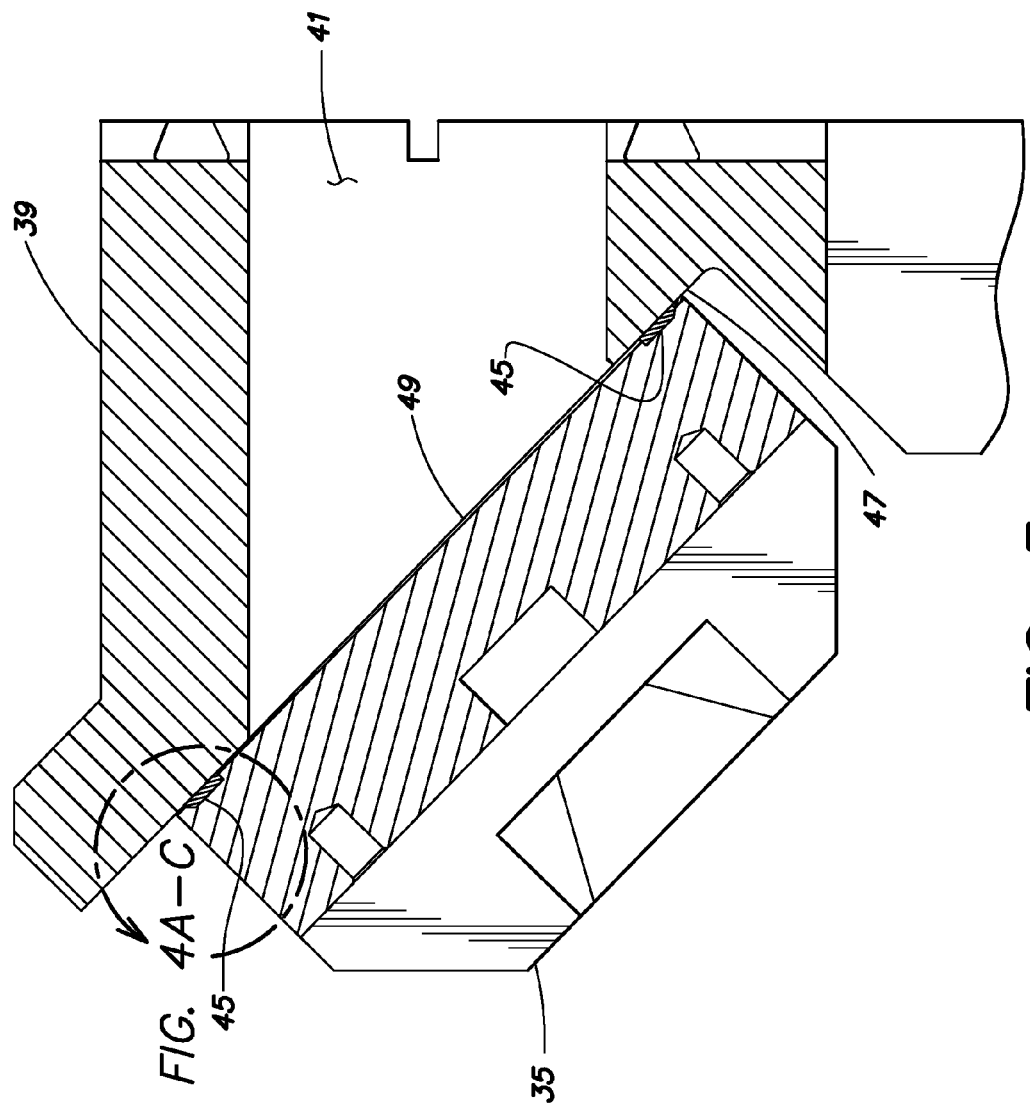
FIG. 3 is a cross-sectional side view of a door and an insert according to some embodiments of the present invention.

Turning to FIG. 3, a cross sectional side view of the slit valve 37 is depicted. An insert 39 may be positioned within the entrance of the slit valve 37 to form a better seal for the door 35. The insert 39 may also include a tunnel 41 or opening to allow a substrate (not shown) to pass from the transfer chamber 13 to the processing chamber 17. In conventional systems, both the door 35 and insert 39 are made of metal. While the metal to metal contact may form a good seal, the opening and closing of the door 35 may cause metal particles to be scraped from both the door 35 and the insert 39. The metal particles may interfere with the processing in the processing chamber 17 or contaminate substrates moving within the system. In accordance with embodiments of the invention, a gap 43, shown in FIG. 4C, may be formed between the door 35 and the insert 39 to prevent the metal to metal contact. The gap 43 may be partially filled by a sealing apparatus 45, to seal the slit valve 37.

In alternate embodiments, the door 35 may directly contact an entrance to the processing chamber 17, and the gap 43 may be formed between the door 35 and the processing chamber 17 entrance to prevent metal to metal contact therebetween. The gap 43 may be partially filled by the sealing apparatus 45, to seal the slit valve 37, as further described below. In yet other alternate embodiments, the door 35 may directly contact an entrance to the transfer chamber 13, and the gap 43 may be formed between the door 35 and the transfer chamber 13 entrance to prevent metal to metal contact therebetween. The gap 43 may be partially filled by the sealing apparatus 45, to seal the slit valve 37, as further described below.

The insert 39 may have a transfer surface 47, facing the transfer chamber 13. The transfer surface 47 may include an opening which forms the entrance to the tunnel 41 that leads to the processing chamber 17. An inner door surface 49 of the door 35 may face the insert 39. When the door 35 is in the closed position, as shown herein, a perimeter of the inner door surface 49 may be positioned adjacent to the transfer surface 47 of the insert 39. As described above, the gap 43 may be formed between the inner door surface 49 and the transfer surface 47 to prevent the metal to metal contact between the insert 39 and the door 35. The sealing apparatus 45 may surround the perimeter of the inner door surface 49 to partially fill the gap 43. In some embodiments, the sealing apparatus 45 may be adhered to the inner door surface 49 during a bonding process (e.g., a vulcanization process). However, this is for purposes of example only, and the sealing apparatus 45 may be attached to the door 35 through other available means such as by any suitable adhesive, mechanical fastening, or the like. Alternatively, the sealing apparatus 45 may be attached to the transfer surface 47 of the insert 39, or the processing chamber 17 entrance or transfer chamber 13 entrance in embodiments without the insert 39, via similar suitable means.

Figure 4A:
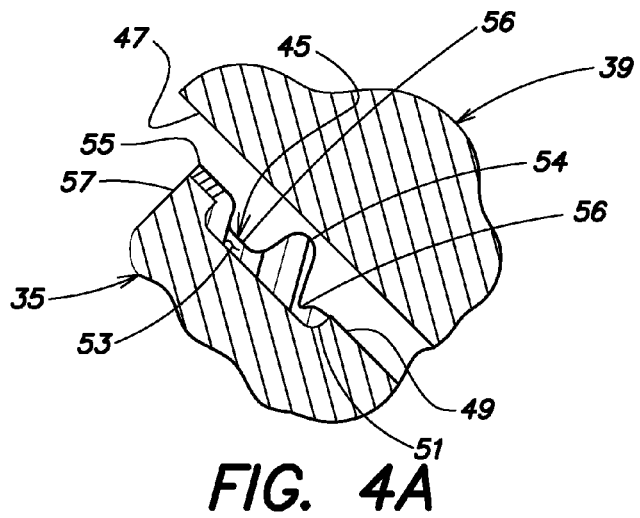
FIGS. 4A, 4B, and 4C are enlarged partial cross-sectional views of the area indicated by a dashed circle and labeled as "FIG. 4A-C" in FIG. 3 showing a sealing apparatus structure and successive steps of compression of the sealing apparatus according to some embodiments of the present invention.
Figure 4B:
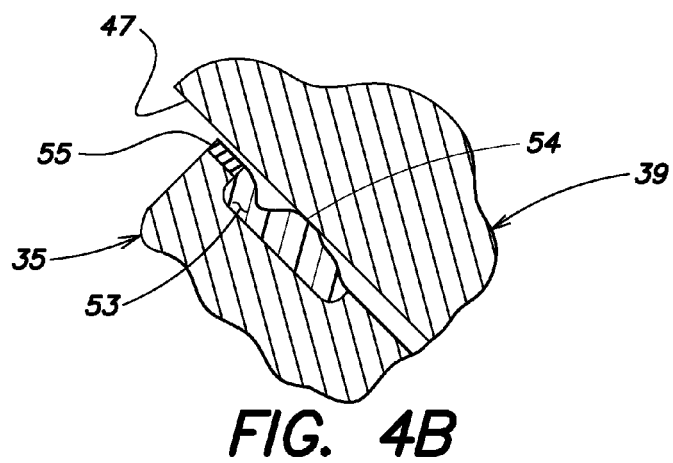
Figure 4C:
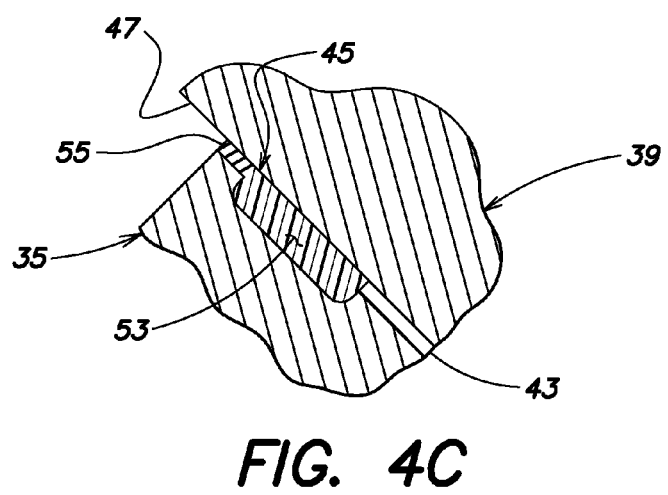

FIGS. 4A, 4B and 4C are enlarged partial views of the area denoted by a dashed circle in FIG. 3, and show successive steps of a compression of the sealing apparatus 45.

In FIG. 4A, the door 35 is shown in an open position. The perimeter of the inner door surface 49 may have a groove 51 formed therein for receiving a portion of the sealing apparatus 45. The sealing apparatus 45 may include a seal 53 for filling the groove 51. The sealing apparatus 45 may also include a hard stop 55. The hard stop 55 may extend along a perimeter of the inner door surface 49 alongside the seal for at least a portion of a length of the seal. In some embodiments, the hard stop 55 may be provided between the seal 53 and an outer edge 57 of the door 35. The hard stop 55 may be formed integrally with the seal 53, for example.

The seal 53 may be constructed such that when the seal 53 is in the uncompressed state, shown herein, a middle extended portion 54 of the seal 53 may extend above an exposed surface of the hard stop 55 facing the transfer surface 47. In the uncompressed state, a recessed portion 56 may be formed on one or both sides of the extended portion 54 of the seal 53. As will be shown in FIGS. 4B and 4C, as the door 35 closes, the extended portion 54 of the seal 53 may be compressed and deformed into and at least partially fill the one or more recessed portions 56 and seal the door 35. In some embodiments, when the hard stop 55 is in contact with the transfer surface 47 of the insert 39, the extended portion 54 of the seal 53 may not be compressed to the extent that the one or more recessed portions 56 are completely filled during compression and the seal 53 is level with the hard stop 55. The one or more recessed portions 56 may not be completely filled during compression as the seal profile may be designed to ensure the stresses in the recessed portions 56 are well within the material mechanical limits.

The hard stop 55 may be formed such that a thickness of the hard stop 55 is sufficient to prevent the hard stop from substantially compressing or decompressing, when the door 35 is opened and closed. Additionally, in some embodiments the hard stop 55 may have a profile, or non-flat, shape.

As described above, the seal 53 may be adhered to the inner door surface 49 during a bonding (e.g., a vulcanization process) process. A byproduct of the bonding process may be a flashing material that extends from the seal 53. In the embodiment shown herein, the flashing material may be used as the hard stop 55. Alternatively, another material may be used as the hard stop 55, which may be attached to the inner door surface 49 or the transfer surface 47 of the insert 39 by any suitable means. In some embodiments, the hard stop 55 may be formed on one surface of the door 35 or the transfer surface 47 and the seal 45 may be provided on the other surface, for example.

In FIG. 4B, the door 35 is shown to be in the process of closing. As shown herein, as the door 35 closes, the extended portion 54 of the seal 53 contacts the transfer surface 47 of the insert 39. As the door 35 continues to close, the extended portion 54 of the seal 53 may be compressed and may begin to fill the one or more recessed portions 56 on either side of the extended portion 54 of the seal 53.

In FIG. 4C, the door 35 is shown in a closed position. The seal 53 in this embodiment, including the extended portion 54, has been compressed to the extent that the at least one recessed portion 56 shown in FIGS. 4A and 4B, may no longer be present because they have been substantially filled by the extended portion 54 of the compressed seal 53. Or, as described above, in some embodiments, as long as the hard stop 55 is in contact with the transfer surface 47 of the insert 39, the extended portion 54 of the seal 53 may not be compressed to the extent that the one or more recessed portions 56 are completely filled. The exposed surface of the hard stop 55 shown in FIGS. 4A and 4B is no longer exposed herein because the exposed surface of the hard stop 55 contacts the transfer surface 47 of insert 39. Because the hard stop 55 neither substantially compresses nor decompresses, as described above, the hard stop 55 may act as a consistent reference for setting the gap 43 when closing the door 35. In other words, when the seal 53 is fully compressed, the largest width of the gap 43 may be substantially equal to a thickness of the hard stop 55. While the gap 43 still exists between the exposed seal 53 and an inner edge of the insert 39, the width of the gap 43 may be substantially narrowed as compared to conventional sealing methods, where the extended portion 54 is compressed enough to allow for sufficient vacuum seal against the transfer surface 47, but does not minimize the width of the gap 43 between the transfer surface 47 and the inner door surface 49. By substantially decreasing the width of the gap 43, the amount of exposed seal 53 may also substantially decrease. Substantially decreasing the exposure of the seal 53 to the byproducts resulting from the processing of the substrates in the processing chamber 17 may increase the life of the seal 53. Additionally, by providing the hard stop 55 between the seal 53 and an outer edge 57 of the door 35, the hard stop 55 is not substantially exposed to the processing byproducts, and therefore the life of the hard stop 55 may be increased.

Figure 5A:
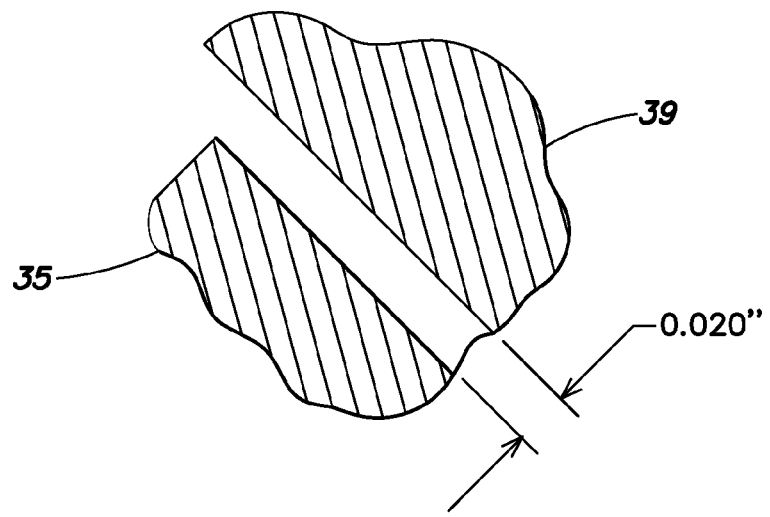
FIGS. 5A and 5B are enlarged partial cross-sectional views of the area indicated by a dashed circle and labeled as "FIG. 4A-C" in FIG. 3 as shown in a conventional system (5A) and with the elastomer seal being fully compressed (5B) as shown in FIG. 4C according to some embodiments of the present invention.
Figure 5B:
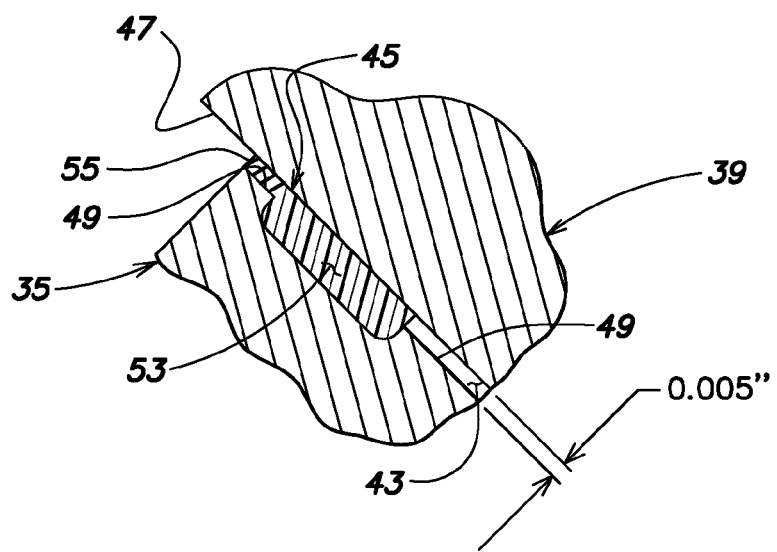

FIG. 5B provides an enlarged partial cross-sectioned view of the area denoted by the dashed circle in FIG. 3. FIG. 5A provides an enlarged partial cross-sectioned view of a similar area as shown in a conventional system, although the conventional seal is not shown herein. FIG. 5B depicts the area with the seal 53 being fully compressed, as also shown in FIG. 4C. As described above with respect to FIGS. 3 and 4A-C, the sealing apparatus 45 may seal the gap 43 between the transfer surface 47 of the insert 39 and the inner door surface 49 thereby sealing the opening to the insert 39 and process chamber 17. Conventional gaps between an inner door surface and a transfer surface of an insert may be approximately 0.020 inches. The present invention may decrease the gap 43, by partially filling the gap 43 with the hard stop 55. In addition to partially filling the gap 43, the hard stop 55 may also set the width of the gap 43 because the hard stop 55 neither substantially compresses nor decompresses. In other words, when the seal 53 is fully compressed, the largest width of the gap 43 may be the thickness of the hard stop 55. In the exemplary embodiment shown herein, the thickness of the hard stop 55, and the corresponding gap 43 may be approximately 0.005 inches. However, in other embodiments, the gap width may be different, depending on, for example, the material used to form the seal, air pressure, and a pneumatic actuator selection. For example, the width of the gap 43 may be between 0.001 and 0.02 inches when the present invention is used. The material used to form the seal may be any suitable flexible sealing material, such as an elastomer material for example. Further suitable materials include any perfluoroelastomer material, such as Kalrez® and Chemraz® compounds for example, or polymer compounds, such as Teflon® or Nylon®, for example, or fluoroelastomer, such as Viton®, for example. The profile of the seal 53 may be changed to accommodate the hard stop 55 material and ensure that the seal 53 compression is within acceptable design limits of the sealing material.

Figure 6:
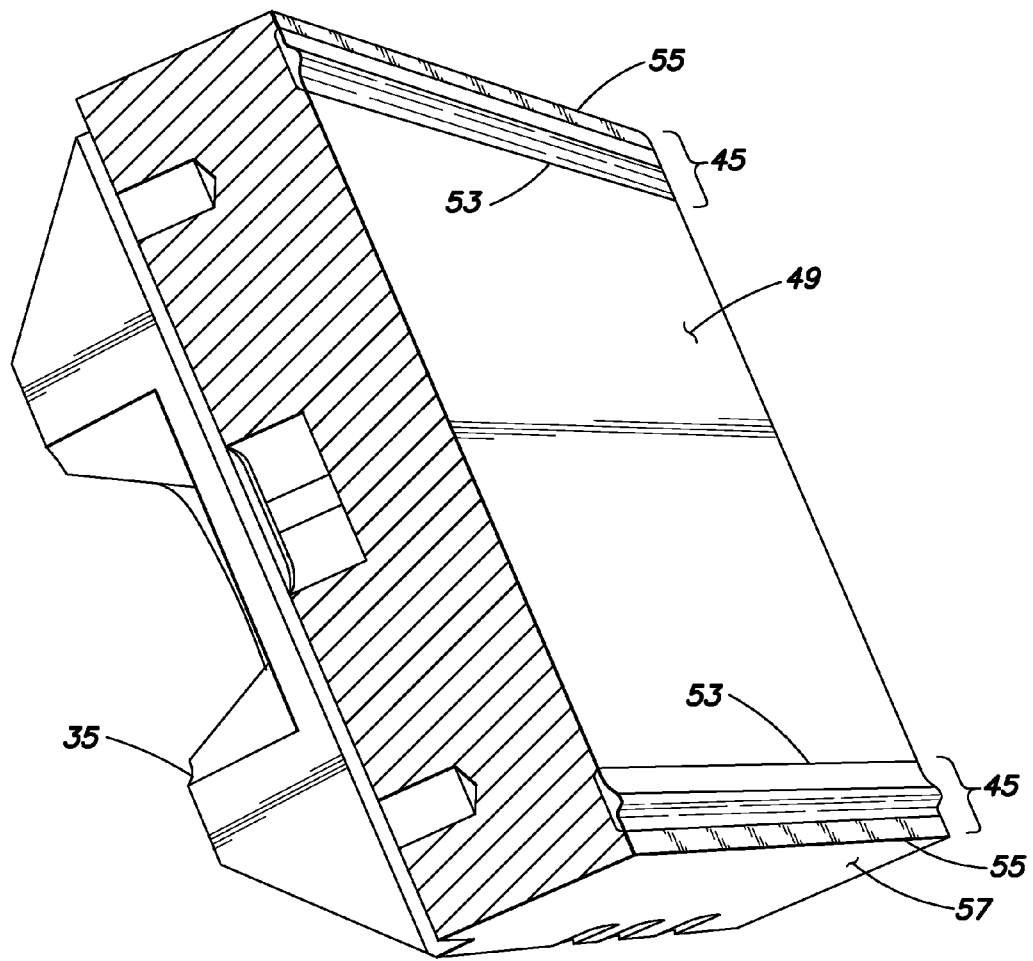
FIG. 6 is a cross-sectional perspective cutout view (with front and back portions removed for clarity) of a door according to some embodiments of the present invention.

Turning to FIG. 6, a perspective cross-sectional view of another embodiment of a door 35 is depicted. Front and back portions of the door and seal have been removed for clarity. The seal 53 may extend along a perimeter of the inner door surface 49. The hard stop 55 may extend along at least a portion of the perimeter of the inner door surface 49 between the seal 53 and the outer edge 57 of the door 35, for example. The hard stop 55 (shaded region) may be in offset from, but integral with, the seal 53. It should be recognized that the seal 53 and the hard stop 55 may extend along the perimeter of the inner door surface in the front and back portions of the door, which are not depicted.

Figure 7:
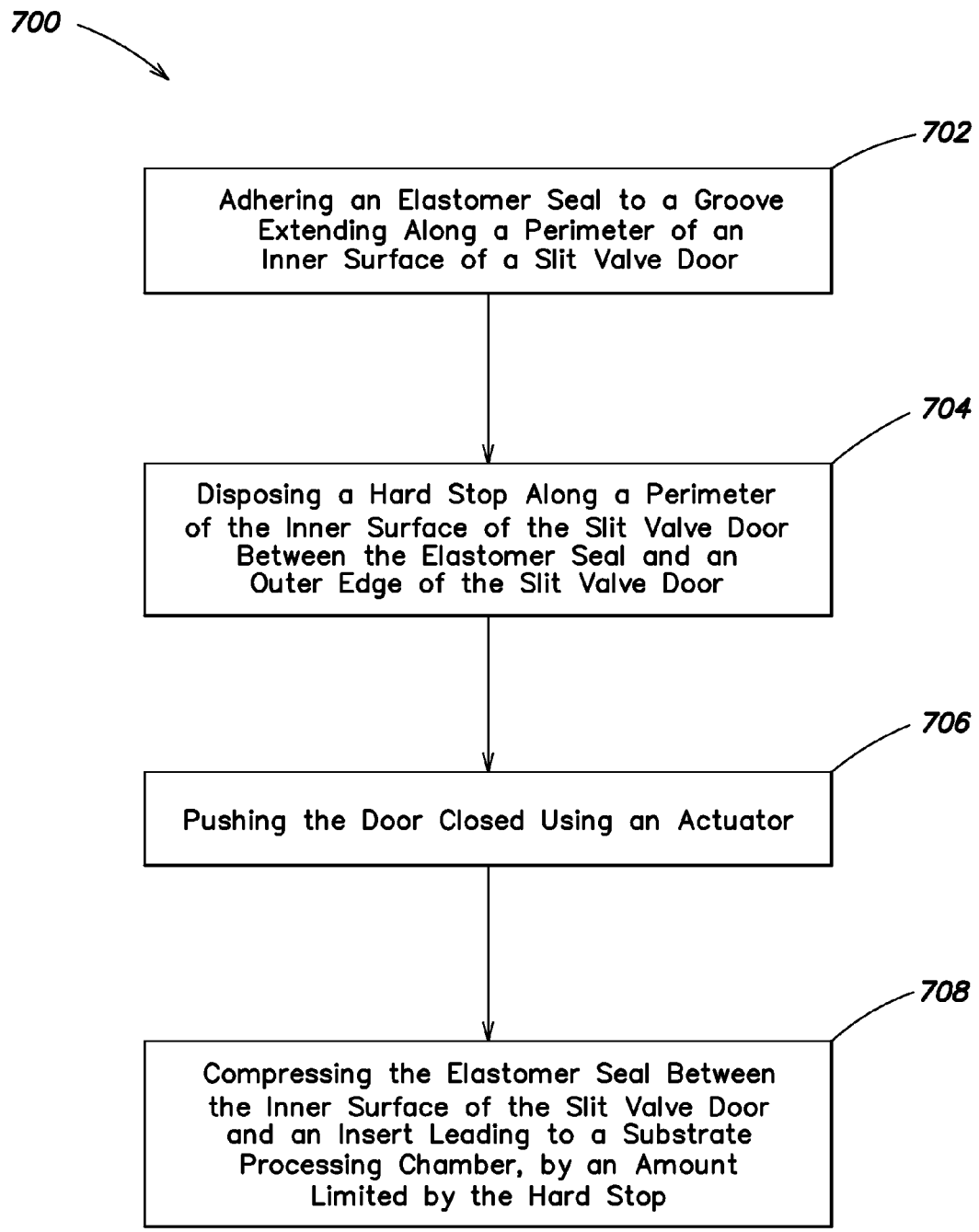
FIG. 7 is a flowchart depicting an example method according to some embodiments of the present invention.

Turning to FIG. 7, a flowchart illustrating an exemplary method 700 of sealing a slit valve door 35 according to the present invention is provided. In step 702, a seal may be adhered to a groove extending along a perimeter of an inner surface of a slit valve door. In step 704, a hard stop may be disposed along a perimeter of the inner surface of the slit valve door, such as between the seal and an outer edge of the slit valve door. In step 706, the door 35 is pushed closed, such as by an actuator 33. In step 708, the seal is compressed between the inner surface of the slit valve door 35 and an insert leading to a substrate processing chamber by an amount limited by the hard stop.

Figure 8:
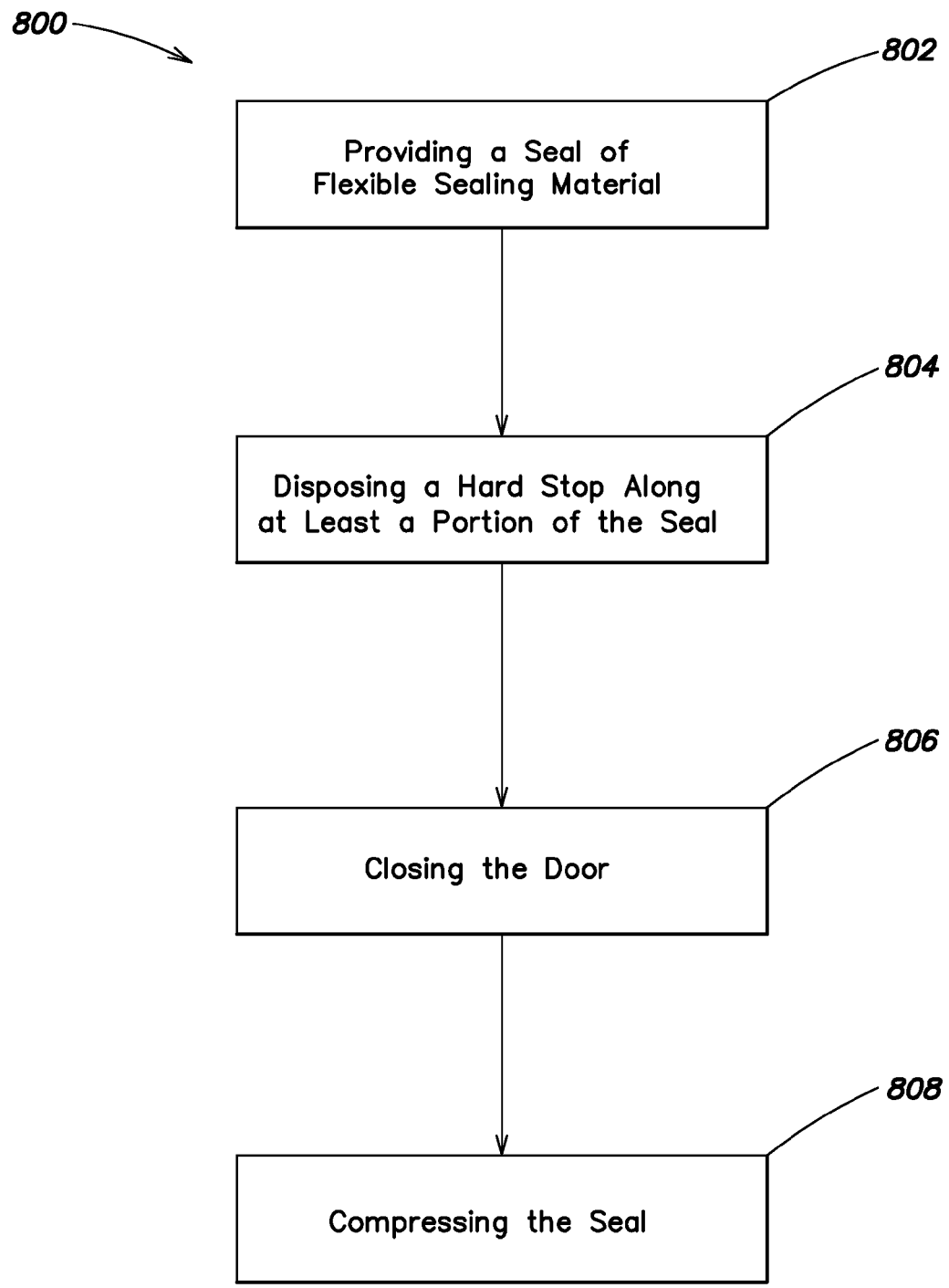
FIG. 8 is a flowchart depicting another example method according to some embodiments of the present invention.

Turning to FIG. 8, a flowchart illustrating another exemplary method 800 of sealing a slit valve door 35 according to the present invention is provided. In step 802, a seal formed from a flexible sealing material is provided. The seal may extend along a perimeter of a surface of a slit valve door. In step 804 the hard stop may be disposed along at least a portion of a perimeter of the seal. In step 806 the door is closed. In some embodiments, the door may be pushed closed by an actuator. In step 808 the seal may be compressed. In some embodiments the compression may be between the surface of the slit valve door and an insert leading to a substrate processing chamber, wherein the compression of the seal may be limited by the hard stop. In operation, byproducts are produced from processing substrates in the processing chamber. The byproducts travel through the tunnel between the processing chamber and the transfer chamber towards the transfer chamber. The byproducts tend to attach to parts that are cooler than the processing chamber, including the seal 53 (FIG. 4) and the slit valve door 35 (FIG. 3). When the slit valve door 35 is opened, the seal 53 is decompressed, but the portion exposed to the byproducts is only minimally (if at all) decompressed (since this portion was only minimally (if at all) compressed due to the hard stop), which may reduce the amount of byproduct coating that may flake off. In other words, in certain embodiments, the compression and decompression of the seal are regulated or limited, such that the seal may only be compressed to a width substantially equal to the width of the hard stop. This controlled set amount of compression may result in a decrease in the width of the gap leading to the seal. The decreased width (or alternatively, increased aspect ratio) may increase the amount of time it takes the byproduct to reach the seal, thereby increasing the amount of time for the byproduct to build-up on the exposed seal and subsequently flake off than in conventional systems and consequently results in a slower degradation of the seal than in conventional systems. The decreased width may result in a 50% increase in life of the seal, for example.

The foregoing description discloses only exemplary embodiments of the invention; modifications of the above disclosed methods and apparatus which fall within the scope of the invention will be readily apparent to those of ordinary skill in the art.

Accordingly, while the present invention has been disclosed in connection with specific embodiments thereof, it should be understood that other embodiments may fall within the spirit and scope of the invention, as defined by the following claims.

The invention claimed is:

1. A method for sealing a unitary slit valve door having a groove formed therein, comprising:
   providing a seal of flexible seal material disposed within the groove between a surface surrounding an opening to a process chamber and a surface of the slit valve door;
   disposing a hard stop alongside at least a portion of the seal between the seal and the groove and on an outside edge of the slit valve door, the hard stop formed integrally with the seal, wherein the hard stop and the outside edge of the slit valve door are aligned, and wherein the hard stop is protected from exposure to process gas; and
   compressing the seal between the surface of the slit valve door and the surface adjacent to the opening whereby deformation of the seal is limited by the hard stop.

2. A method for sealing a unitary door of a slit valve having a groove formed therein, comprising:
   adhering a seal to the groove extending along a perimeter of a surface of the slit valve door;
   disposing a hard stop along at least a portion of a perimeter of the surface of the slit valve door between the seal and the groove and on an outside edge of the slit valve door, the hard stop formed integrally with the seal, wherein the hard stop and the outside edge of the slit valve door are aligned, and wherein the hard stop is protected from exposure to process gas; and
   compressing the seal between the inner surface of the slit valve door and a substrate sealing surface.

3. The method of claim 2, wherein compressing the seal further comprises:
   closing the door.

4. An apparatus for sealing a door of a slit valve, comprising:
   a unitary slit valve door having a groove formed therein;
   a seal disposed within the groove and adapted to extend along a perimeter of the slit valve door; and
   a hard stop, disposed laterally outward of the seal and the groove and on an outside edge of the slit valve door, the hard stop formed integrally with the seal, wherein the hard stop and the outside edge of the slit valve door are aligned, and wherein the hard stop is protected from exposure to process gas.

5. The apparatus of claim 4 further comprising an insert leading to a processing chamber; wherein the hard stop and the seal fill at least a portion of a gap between the slit valve door and the insert leading to the processing chamber.

6. The apparatus of claim 5, wherein the slit valve door has an inner surface facing the process chamber; wherein the inner surface has the groove extending along a perimeter thereof, wherein the groove is adapted to receive the seal.

7. The apparatus of claim 4, wherein the seal is adhered to the door during a bonding process.

8. The apparatus of claim 7, wherein the hard stop is a flashing material left as part of the bonding process.

9. The apparatus of claim 4, wherein the hard stop is made from a material separate from the seal material.

10. The apparatus of claim 4, wherein the hard stop has a thickness of approximately 0.005 inches.

11. The apparatus of claim 4, wherein a width of the gap is less than approximately 0.020 inches.

12. The apparatus of claim 4, wherein the thickness of the hard stop is substantially constant.

13. The apparatus of claim 4, wherein the seal includes an extended portion and at least one recessed portion proximate the extended portion when the seal is in an uncompressed state.

14. The apparatus of claim 13 wherein the extended portion of the seal substantially fills the at least one recessed portion of the seal when the seal is in a compressed state.

15. An apparatus for sealing a substrate transfer passage of a substrate processing system, comprising:
   a unitary slit valve door having a groove formed therein;
   a seal of flexible sealing material disposed within the groove and extending along a perimeter of the slit valve door, the seal bonded to the slit valve door; and
   a hard stop disposed between the seal and the groove of the slit valve door, and on an outside edge of the slit valve door, wherein the hard stop is formed integrally with the seal, and wherein the hard stop and the outside edge of the slit valve door are aligned, and wherein the hard stop is protected from process gas.

16. A system comprising:
   a transfer chamber;
   a processing chamber;
   a slit valve connecting the transfer chamber to the processing chamber;
   a unitary slit valve door having a groove formed therein, selectively positioned in front of a substrate sealing surface; and
   a sealing apparatus including a seal disposed within the groove and a hard stop adapted to fill a portion of a gap between the slit valve door and the substrate sealing surface, wherein the hard stop is positioned between the seal and the groove and on an outside edge of the slit valve door, wherein the hard stop is formed integrally with the seal, and wherein the hard stop and the outside edge of the slit valve door are aligned, and wherein the hard stop is protected from exposure to process gas.

17. The system of claim 16, wherein the seal is adhered to the slit valve door during a bonding process, and the hard stop is a flashing material left as part of the bonding process.

18. The system of claim 16, wherein the hard stop is made from a material separate from the seal.

19. The system of claim 16, wherein the thickness of the hard stop is substantially constant.

20. The system of claim 16, wherein the hard stop has a thickness of approximately 0.005 inches.

21. The system of claim 16, wherein an insert is positioned at an entrance to the slit valve and the substrate sealing surface is formed on the insert.

22. The apparatus of claim 4, wherein the seal is vulcanized to the slit valve door.

23. The apparatus of claim 15, wherein the seal is vulcanized to the slit valve door.

* * * * *